(12) United States Patent
Chiu et al.

(10) Patent No.: US 12,543,612 B2
(45) Date of Patent: Feb. 3, 2026

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Chao-Wei Chiu, Hsinchu (TW); Jen-Jui Yu, Taipei (TW); Hsuan-Ting Kuo, Taichung (TW); Cheng-Shiuan Wong, Hsinchu (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 429 days.

(21) Appl. No.: 18/151,743

(22) Filed: Jan. 9, 2023

(65) Prior Publication Data
US 2024/0186275 A1  Jun. 6, 2024

Related U.S. Application Data

(60) Provisional application No. 63/385,815, filed on Dec. 2, 2022.

(51) Int. Cl.
*H01L 23/00* (2006.01)
*H01L 21/48* (2006.01)
(Continued)

(52) U.S. Cl.
CPC .......... *H01L 24/13* (2013.01); *H01L 21/4853* (2013.01); *H01L 23/49816* (2013.01); *H01L 24/11* (2013.01); *H01L 25/0652* (2013.01); *H01L 25/0655* (2013.01); *H01L 23/3675* (2013.01); *H01L 23/49833* (2013.01); *H01L 24/05* (2013.01); *H01L 24/29* (2013.01); *H01L 24/32* (2013.01); *H01L 2224/05624* (2013.01);
(Continued)

(58) Field of Classification Search
CPC ................. H01L 24/13; H01L 21/4853; H01L 23/49816; H01L 24/11; H01L 25/0652; H01L 25/0655; H01L 23/3675; H01L 23/49833; H01L 24/05; H01L 24/29; H01L 24/32; H01L 2224/05624; H01L 2224/05644; H01L 2224/05647; H01L 2224/05655; H01L 2224/05664; H01L 2224/11849; H01L 2224/13111; H01L 2224/13113; H01L 2224/13117
See application file for complete search history.

(56) References Cited

U.S. PATENT DOCUMENTS

2010/0307823 A1* 12/2010 Kawamata ........... B23K 35/262
                                                        228/101
2021/0193605 A1*  6/2021 Tseng .............. H01L 23/49894
2022/0037231 A1   2/2022 Hsiao et al.

FOREIGN PATENT DOCUMENTS

TW          201431025 A       8/2014

* cited by examiner

*Primary Examiner* — Karen Kusumakar
(74) *Attorney, Agent, or Firm* — Slater Matsil, LLP

(57) ABSTRACT

Semiconductor devices including the use of solder materials and methods of manufacturing are provided. In embodiments the solder materials utilize a first tensile raising material, a second tensile raising material, and a eutectic modifier material. By utilizing the materials a solder material can be formed and used with a reduced presence of needles that may otherwise form during the placement and use of the solder material.

20 Claims, 4 Drawing Sheets

(51) Int. Cl.
*H01L 23/498* (2006.01)
*H01L 25/065* (2023.01)
*H01L 23/367* (2006.01)

(52) U.S. Cl.
CPC ........... *H01L 2224/05644* (2013.01); *H01L 2224/05647* (2013.01); *H01L 2224/05655* (2013.01); *H01L 2224/05664* (2013.01); *H01L 2224/11849* (2013.01); *H01L 2224/13111* (2013.01); *H01L 2224/13113* (2013.01); *H01L 2224/13117* (2013.01); *H01L 2224/13139* (2013.01); *H01L 2224/13147* (2013.01); *H01L 2224/13155* (2013.01); *H01L 2224/29193* (2013.01); *H01L 2224/2929* (2013.01); *H01L 2224/29324* (2013.01); *H01L 2224/29339* (2013.01); *H01L 2224/29347* (2013.01); *H01L 2224/29386* (2013.01); *H01L 2224/32245* (2013.01); *H01L 2924/01032* (2013.01); *H01L 2924/014* (2013.01); *H01L 2924/0503* (2013.01); *H01L 2924/05032* (2013.01); *H01L 2924/0543* (2013.01)

SEMICONDUCTOR DEVICES AND METHODS OF FORMING THE SAME

PRIORITY CLAIM AND CROSS-REFERENCE

This application claims the benefit of U.S. Provisional Application No. 63/385,815, filed on Dec. 2, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is three-dimensional Package-on-Package (POP) technology. In a POP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
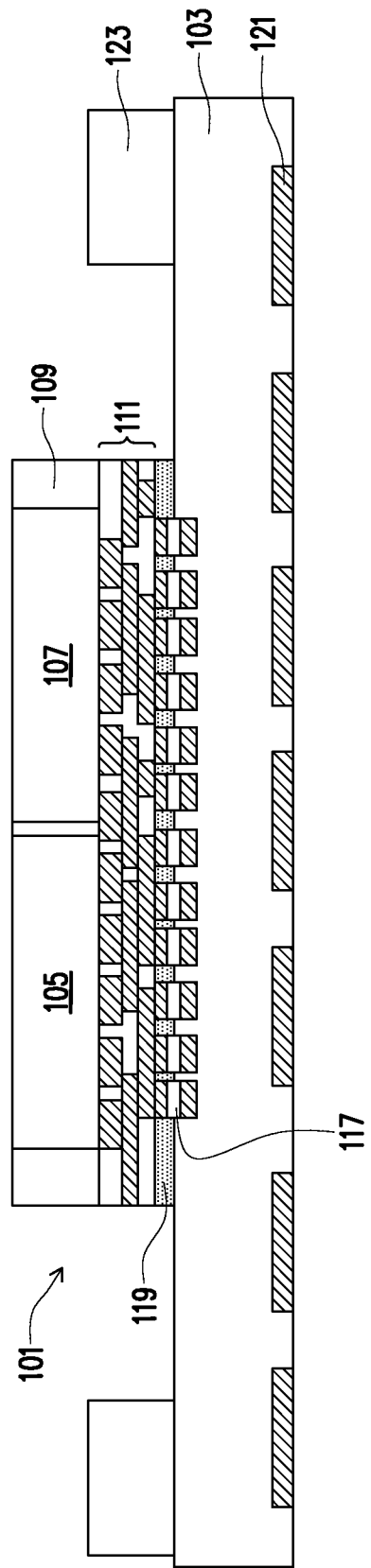
FIG. 1 illustrates a chip on wafer package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which external connectors are utilized in a chip-on-wafer package. This embodiment, however, is intended to be illustrative and is not intended to limit the ideas to the specific embodiments (e.g., a chip-on-wafer on substrate (CoWoS)) presented herein. Rather, the ideas presented may be implemented in any suitable embodiment, such as flip-chip ball grid arrays/chip scale packages (BGA/CSP), fan-out packages, wafer level chip scale packages (WLCSP), integrated fan-out packages (InFO), integrated fan-out packages on substrate (InFO_oS), or any other packages which include or use ball grid arranges. All such embodiments are fully intended to be included within the scope of the disclosure.

With reference now to FIG. 1, this figure illustrates a first package 101 (e.g., a chip-on-wafer (CoW) package) bonded to a substrate 103. The first package 101 may be referred to herein as an interposer package, a semiconductor chip package, a stacked chip package, a stacked semiconductor device package, a stacked device package, or the like. According to some embodiments, the first package 101 may include a first semiconductor die 105 disposed adjacent to a second semiconductor die 107. The first semiconductor die 105 and the second semiconductor die 107 may be single dies or die stacks and may be referred to as chips. The first semiconductor die 105 may be a processor, such as a system-on-chip (SoC), a central processing unit (CPU), a graphics processing unit (GPU), or the like. The second semiconductor die 107 may be a memory die such as a DRAM, high bandwidth memory (HBM), memory cube, a memory stack, or the like. While FIG. 1 illustrates a first package 101 having one first semiconductor die 105 and one second semiconductor die 107, other embodiments may include any number of semiconductor dies.

The first semiconductor die 105 and the second semiconductor die 107 may be surrounded by an encapsulant 109 which includes, e.g., a molding compound. The first semiconductor die 105, the second semiconductor die 107, and the encapsulant 109 may be planarized such that top surfaces of the first semiconductor die 105, the second semiconductor die 107, and the encapsulant 109 are level and coplanar with each other.

The first semiconductor die 105 and the second semiconductor die 107 are bonded to a top surface of a package component 111. The first semiconductor die 105 and the second semiconductor die 107 may be electrically and mechanically bonded to the package component 111 using, e.g., a dielectric-to-dielectric and metal-to-metal bonding process, a fusion bonding process, first connectors such as conductive bumps, micro bumps, metal pillars, combinations of these, or the like.

The package component 111 may be an interposer substrate, which may be a semiconductor substrate such as a silicon substrate. The package component 111 may also be formed of another semiconductor material such as silicon germanium, silicon carbon, or the like. In accordance with some embodiments, active devices such as transistors (not separately illustrated) are formed at a surface of the package component 111. Passive devices (not separately illustrated) such as resistors and/or capacitors may also be formed in the package component 111. In accordance with alternative embodiments of the present disclosure, the package component 111 may be a semiconductor substrate or a dielectric substrate, and the respective package component 111 may not include active devices therein. In accordance with these embodiments, the package component 111 may, or may not, include passive devices formed therein.

The package component 111 may also include or simply be an interconnect structure which is used to electrically connect integrated circuit devices of the first package 101. The interconnect structure may include a plurality of dielectric layers, metal lines formed in the dielectric layers, and vias formed between, and interconnecting, the overlying and underlying metal lines. In accordance with some embodiments, the dielectric layers may be formed of silicon oxide, silicon nitride, silicon carbide, silicon oxynitride, combinations thereof, and/or multi-layers thereof. In other embodiments, the dielectric layers may include one or more low-k dielectric layers having low dielectric constants (k values). The k values of the low-k dielectric materials in the dielectric layers may be lower than about 3.0 or lower than about 2.5, for example. In some embodiments, the package component 111 may comprise through vias (not separately illustrated) which may be formed to extend from the top surface of the package component 111 into the package component 111. In embodiments in which the package component 111 is a silicon interposer or an organic interposer, the through vias may be referred to as through-substrate vias or through-silicon vias.

The package component 111 of the first package 101 is bonded to a top surface of the substrate 103. The package component 111 may be electrically and mechanically coupled to the substrate 103 through second connectors 117, which may be conductive bumps, micro bumps, metal pillars, or the like. A second underfill material 119 may be formed or placed between the package component 111 and the substrate 103, surrounding the second connectors 117.

The substrate 103 may be a package substrate, which may be a printed circuit board (PCB) or the like. The substrate 103 may include one or more dielectric layers and electrically conductive features, such as conductive lines and vias. In some embodiments, the substrate 103 may include through-vias, active devices, passive devices, and the like. The substrate 103 may further include conductive pads formed at the upper surfaces of the substrate 103. The second connectors 117 may be coupled to the conductive pads at the top surface of the substrate 103.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

On an opposite side of the substrate 103 from the second connectors 117, external pads 121 are formed to prepare for further connections. In an embodiment the external pads 121 may be a conductive material formed using, e.g., an electroplating process, such as an electroless nickel-electroless palladium-immersion gold technique (ENEPIG). However, in other embodiments the external pads 121 may be formed from a conductive material such as aluminum formed using a deposition and patterning process, or a material such as copper using a patterning and plating process. Any suitable material and any suitable method of formation may be utilized, and all such materials and methods are fully intended to be included within the scope of the embodiments.

An adhesive 123 is deposited on the substrate 103. The adhesive 123 may be an epoxy, a silicon resin, a glue, or the like. The adhesive 123 may have a thermal conductivity from about 1 W/m·K to about 3 W/m·K, lower than about 0.5 W/m·K, or the like. The adhesive 123 may be positioned so as to allow a heat dissipating feature (e.g., a first lid 403, not separately illustrated in illustrated in FIG. 1 but illustrated and discussed further below with respect to FIG. 4) to be attached around the first package 101. Thus, in some embodiments, the adhesive 123 may be disposed around the perimeter of, or even encircle, the first package 101.

Figure 2:
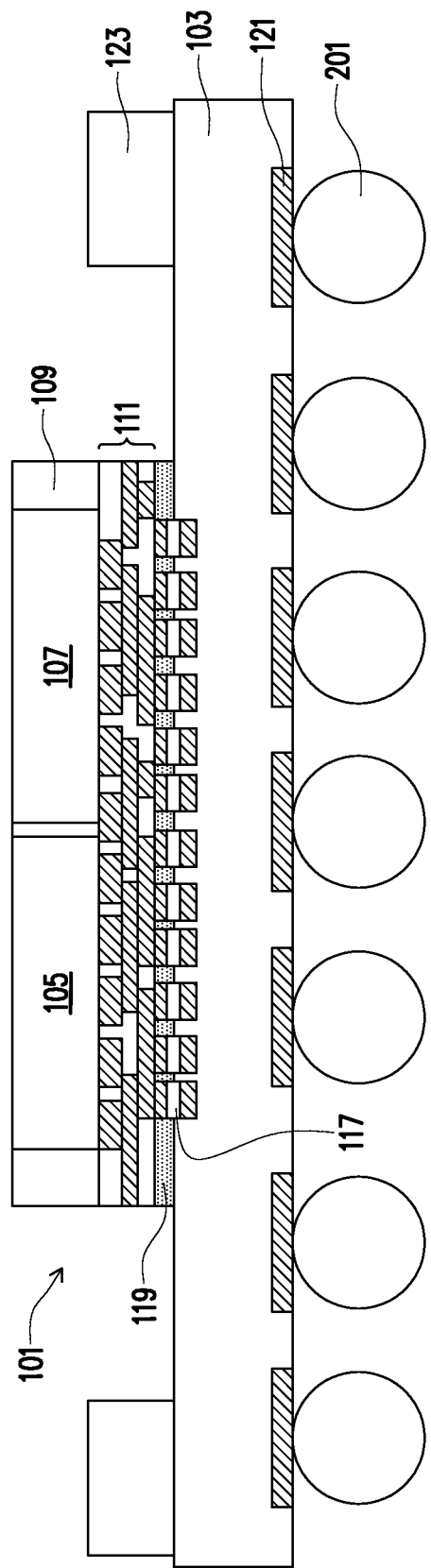
FIG. 2 illustrates placement of external connectors, in accordance with some embodiments.

FIG. 2 illustrates placement of first external connections 201 on the external pads 121. In an embodiment the first external connections 201 may comprise a solder material designed to maintain a large tensile strength while still avoiding formation of undesired needles of crystals that may degrade the structure of the first external connections 201. In a particular embodiment the first external connections 201 may be an alloy comprising a fill material, a first tensile material, a second tensile material, a eutectic modifier, an interfacial intermetallic compound (IMC) suppressor, and an oxide protector. In an embodiment the fill material may be a conductive material such as tin or the like. However, any suitable material and any suitable percentage may be utilized.

The first tensile raising material is added to the fill material in order to help raise the tensile strength of the first external connections 201. In an embodiment the first tensile raising material is a conductive material such as silver, copper, bismuth, antimony, indium, combinations of these, or the like. In a particular embodiment the first tensile raising material may be present in a low range from between about 2.2%-wt and about 2.8%-wt, such as about 2.5%-wt, of the first external connections 201. When the percentage of the first tensile raising material is below this range, the tensile strength may not be increased as desired. Further, when the percentage of the first tensile raising material is above this range, then it becomes harder to avoid the formation of IMC needles within the first external connections 201 during, e.g., a subsequent reflow process (not illustrated in FIG. 2 but illustrated and described further below with respect to FIG. 3).

The second tensile raising material is added to the fill material in order to help further raise the tensile strength of the first external connections 201. In an embodiment the second tensile raising material is a conductive material such as bismuth, copper, silver, antimony, indium, combinations of these, or the like. In a particular embodiment the second tensile raising material may be present in a range from between about 4%-wt and about 4.4%-wt of the first external connections 201. When the percentage of the second tensile raising material is below this range, the tensile strength is not increased as desired. Further, when the percentage of the second tensile raising material is above this range, then the cooling process must be performed for a longer time, which leads to further formation of the undesired needles.

The eutectic modifier is added to the fill material in order to help modify the eutectic composition and prevent undesired crystallization at the desired reflow temperature (described further below). In an embodiment the eutectic modifier may be a conductive material such as copper, silver, combinations of these, or the like, and may be present in a range from between about 0.5%-wt and about 1.1%-wt of the first external connections 201. When the percentage of the eutectic modifier is outside of this range (e.g., either too high or too low), undesired crystals may be prematurely formed during the reflow process.

The IMC suppressor is utilized in order to help suppress formation of an intermetallic compound at the interface between the first external connections 201 and the underlying external pads 121. In an embodiment the IMC suppressor may be a conductive material such as nickel, palladium, zinc, combinations of these, or the like, and may be present in a range from between about 0.01%-wt. and about 0.5%-wt., such as about 0.05%-wt. However, any suitable material at any suitable percentage may be utilized.

The oxide protector is utilized to help suppress and prevent oxidation of the first external connections 201 after the formation and during, e.g., storage. In an embodiment the oxide protector may be a material such as germanium, phosphorous, combinations of these, or the like, and may be present in a range from between about 0.007%-wt and about 0.002%-wt. However, any suitable material and any suitable percentage may be utilized.

Once prepared, the first external connections 201 may be physically combined and shaped into a ball shape, such as a ball with a size of between about 0.03 mm and about 0.6 mm. Once the balls have been shaped, the balls may be placed onto the external pads 121. In an embodiment the placement may be performed using, e.g., a ball drop method, such as a direct ball drop process. However, any other suitable process, such as using a stencil, or even depositing the materials for the first external connections 201 using one or more plating processes, may be used to place the first external connections 201 onto the external pads 121. Any and all suitable methods for the placement or formation of the first external connections 201 may be utilized, and all such processes are fully intended to be included within the scope of the embodiments.

Figure 3:
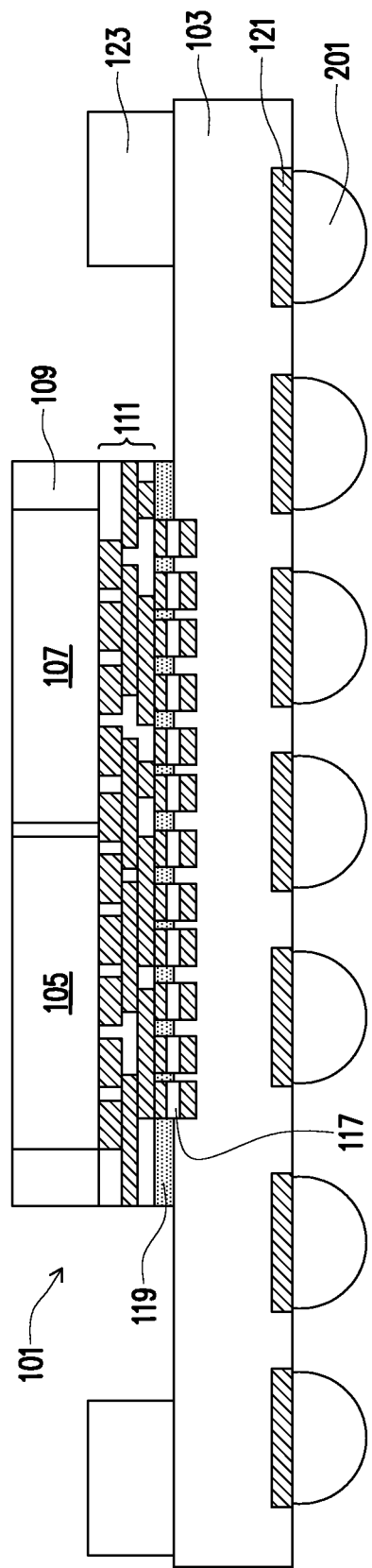
FIG. 3 illustrates a reflow process, in accordance with some embodiments.

FIG. 3 illustrates a reflow process that may be used to reshape the first external connections 201 once the first external connections 201 have been placed. In an embodiment the reflow process may be performed by increasing and lowering the temperature of the first external connections 201 in a controlled fashion. In a particular embodiment a furnace with multiple heating zones, such as 10-13 heating zones (not separately illustrated in FIG. 3) may be used, wherein each of the individual heating zones may maintain an ambient temperature that is higher or lower than adjacent ones of the multiple heating zones, in order to allow for a step-wise increasing and decreasing of the temperatures. However, any suitable furnace that can increase and decrease the temperature of the first external connections 201 may be utilized, and all such furnaces are fully intended to be included within the scope of the embodiments.

In the embodiment in which a furnace with multiple heating zones is utilized, the first package 101 with the first external connections 201 is initially placed onto, e.g., a conveyor belt which feeds into a first one of the multiple zones. In the first one of the multiple zones, the furnace maintains an ambient temperature that is higher than the ambient temperature outside of the furnace (e.g., room temperature). As the first package 101 moves through the first one of the multiple zones, the ambient temperature within the first one of the multiple zones raises the temperature of the first external connections 201 from the ambient temperature outside of the furnace.

Once the first package 101 has moved through the first one of the multiple zones (and has had its temperature increased), the conveyor moves the first package 101 into an adjacent second one of the multiple zones. In an embodiment the second one of the multiple zones maintains an ambient temperature that is higher than the ambient temperature of the first one of the multiple zones. As such, as the first package 101 moves through the second one of the multiple zones, the first external connections 201 will have their temperatures increased further from the first one of the multiple zones.

In this fashion, the first package 101 will move through the various multiple zones, wherein each zone increases the temperature of the first external connections 201 until the first external connections 201 reaches its eutectic temperature and the first external connections 201 begin to reflow. In an embodiment utilizing the above described compositions, the various multiple zones will raise the temperature of the first external connections 201 to a temperature of between about 217° C. and about 245° C., such as about 235° C., for a time period of between about 60 s and about 90 s (at, e.g., a temperature above 217° C.). However, any suitable maximum temperature may be utilized.

Once the maximum temperature has been reached and the first external connections 201 have shifted phase and begun to reflow, subsequent ones of the multiple zones are then utilized to reduce the temperature of the first external connections 201 in order to change the phase back to a solid form and stop the reflow process. In an embodiment the temperature of the first external connections 201 may be lowered by the first package 101 moving to subsequent heating zones that maintain lower ambient temperatures than the maximum temperature. In a particular embodiment the zones may be used to lower the temperature of the first external connections 201 at a rate of between about 1° C./second and about 1.6° C./second. However, any suitable rate of cooling may be utilized.

In the particular embodiment described above, the first external connections 201 may have a solidus start point of about 216° C. and has a solidus end point of about 203° C. As such, the difference between the solidus start point and the solidus end point is about 13° C. or more. As such, with a cooling rate of, e.g., about 1° C./second, the first external connections 201 will pass through the solidus temperatures in about 13 seconds. However, any suitable rate of cooling may be utilized.

During the cooling phase of the reflow process, and as the material transits from the solidus start point and the solidus end point, the material of the first external connections 201 will begin to return to a solid phase. During the phase change, the material may first begin to start crystallizing at different points within the material, and then these crystals will grow until the entire first external connections 201 has returned to a fully solid phase. However, if not adequately controlled, some of the crystals that are initially formed may be an undesired phase of materials, and these undesired phases may then grow into larger needles that would allow for cracks to propagate and damage the first external connections 201 during subsequent manufacturing steps.

However, by utilizing the amount of the first tensile raising material (e.g., silver) as described above, crystallization of the first tensile raising material into an IMC such as silicon tin ($Ag_3Sn$) can be suppressed during the time period that the first external connections 201 transit through the solidus temperatures, and the solder alloy solidification primary phase is a liquid type (instead of a liquid type with silver based crystals). Further, by keeping the cooling at a relatively fast pace, any crystallization of the silver tin that does occur (e.g., crystallization that can occur at grain boundaries of the tin) does not have time to continue to grow and form the undesired needles.

By utilizing the compositions and processes described above, more robust first external connections 201 may be formed that are more resistant to damage. In a particular embodiment in which the first external connections 201 have a silver composition of 2.5%, a copper composition of 0.8%, a nickel composition of 0.05%, and a bismuth composition of 4.2%, the first external connections 201 may have a tensile strength of between about 96.05 MPa and 103.12 MPa, such as about 96.7 MPa or 99.58 MPa, and may have an elongation of between about 33.27% and about 39.53%, such as about 35%, 36.40% or 39%. Tensile strength that is less than this range may not be able to sufficient withstand subsequent stresses, while tensile strength larger than this range requires other, undesired trade-offs in composition. Additionally, elongations that are less than this range causes drop test counts to be too low (that may impact consumer devices such as mobile devices, notebooks, etc.).

Figure 4:
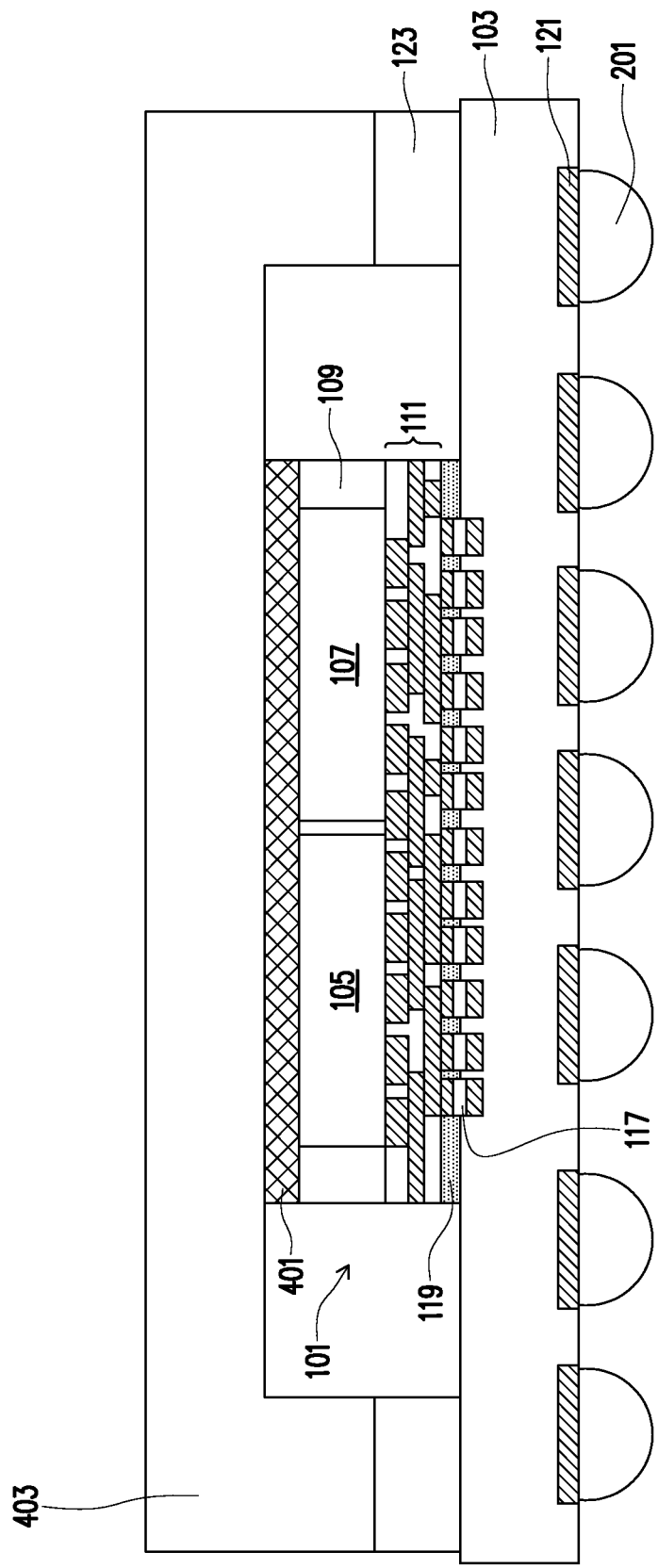
FIG. 4 illustrates placement of a lid, in accordance with some embodiments.

FIG. 4 illustrates placement of a thermal interface material (TIM) 401 and placement of a first lid 403. In an embodiment the TIM 401 may be a polymer having a good thermal conductivity, which may be from about 3 W/m·K to about 5 W/m·K. In some embodiments, the TIM 401 may include a polymer with thermal conductive fillers. The thermal conductive fillers may increase the effective thermal conductivity of the TIM 401 to be from about 10 W/m·K to about 50 W/m·K or more. Applicable thermal conductive filler materials may include aluminum oxide, boron nitride, aluminum nitride, aluminum, copper, silver, indium, a combination thereof, or the like. In other embodiments, the TIM 401 may comprise other materials such as a metallic-based or solder-based material comprising silver, indium paste, or the like. In still further embodiments, the TIM 401 may comprise a film-based or sheet-based material, such as a sheet-based material including synthesized carbon nanotubes (CNTs) or a thermally conductive sheet having vertically oriented graphite fillers. Although the TIM 401 is illustrated as a continuous TIM extending over the first semiconductor die 105 and the second semiconductor die 107, in other embodiments, the TIM 401 may be separate portions physically disconnected from each other. For example, air gaps may be disposed in the TIM 401 between adjacent dies (e.g., the first semiconductor die 105 and/or the second semiconductor die 107) to reduce lateral thermal interaction between the dies. In some embodiments, the TIM 401 may be deposited after the adhesive 123; however, the TIM 401 may also be deposited before the adhesive 123. In some embodiments, the TIM 401 may be provided in a form of fluid glue or a tape. In some embodiments, the adhesive 123 and/or the TIM 401 may be provided on surfaces of a lid (e.g., the first lid 403), and then the first lid 403, the adhesive 123 and the TIM 401 may be adhered to the substrate 103, the encapsulant 109, the first semiconductor die 105, and the second semiconductor die 107. Any suitable order of placement and connection may be utilized, and all such orders are fully intended to be included within the embodiments.

The first lid 403 is attached to the substrate 103 and the first package 101. The first lid 403 may be referred to herein as a heat spreader, a thermal lid, a vapor condensing lid, or the like. The first lid 403 may be attached to protect the first package 101 and the substrate 103 and to spread heat generated from the first package 101 to a larger area, dissipating the heat from the first package 101. The first lid 403 may be formed from a material having a high thermal conductivity, such as steel, stainless steel, copper, aluminum, combinations thereof, or the like. In some embodiments, the first lid 403 may be a metal coated with another metal, such as gold. The first lid 403 may be formed of a material having a thermal conductivity from about 100 W/m·K to about 400 W/m·K, such as about 400 W/m·K. The first lid 403 covers and surrounds the first package 101. In some embodiments, the first lid 403 is a single continuous material. In other embodiments, the first lid 403 may include multiple pieces that may be the same or different materials.

In some embodiments, a curing process may be performed to cure the adhesive 123 and/or the TIM 401. Suitable curing processes may include but are not limited to a clamping curing process. Such clamping curing processes may utilize clamping plates and fasteners to control a clamping force applied between an upper clamping plate and a lower clamping plate. In some embodiments, a clamping force from about 3 kgf to about 100 kgf during a clamping curing process may be used to cure the adhesive 123 and/or the TIM 401. In some embodiments, distribution plates may be disposed between the lower clamping plate and the substrate 103 and/or between the upper clamping plate and the first lid 403. Such distribution plates may be formed of an elastic material, a rubber material, or the like and may be used to evenly distribute the force applied by the clamping plates across the surfaces of the substrate 103 and/or the first lid 403. Once clamped, the structure may be cured while the clamping plates apply the clamping force. However, any suitable temperatures and/or time periods may be used.

By utilizing the composition of the first external connections 201 as described herein and above, the first external connections 201 can proceed through the reflow process without forming or at least suppressing undesired IMC compositions (e.g., silver-based compositions that can grow into undesired needles), such as having 0% $Ag_3Sn$. For example, using the described compositions, the formation of silver-based IMCs may be suppressed, and any crystals that are formed may remain at the grain boundaries between different crystals. Further, given the cooling process, any silver-based IMCs that do form have any subsequent growth suppressed such that needles are not formed, and the first external connections 201 may be formed free from silver-based needles. As such, even if silver-based IMCs do form, the first external connections 201 may still obtain high tensile strength with better board level reliability performance.

Given this lack of silver-based needles, the first external connections 201 are more resistant to cracks and the propagation of cracks. In particular, without the presence of the undesired needles, the undesired needles are unable to provide pathways for cracks once the cracks form. As such, a more robust first external connection 201 with a larger reliability may be obtained.

In accordance with an embodiment, a method of manufacturing a semiconductor device includes: applying an external connector to a substrate, the external connector includes: a first tensile raising material at a first percentage of between about 2.2% and about 2.8%; a second tensile raising material at a second percentage of between about 4% and about 4.4%; and a eutectic modifier at a third percentage of between about 0.5% and about 1.1%; and reflowing the external connector. In an embodiment the first tensile raising material comprises silver, the second tensile raising material comprises bismuth, and the eutectic modifier comprises copper. In an embodiment the substrate is part of a fan-out package. In an embodiment the substrate is part of a wafer level chip scale package. In an embodiment the substrate is part of an integrated fan out on substrate structure. In an embodiment the substrate is part of a chip on wafer on substrate. In an embodiment the external connector further includes: nickel; and germanium.

In accordance with another embodiment, a method of manufacturing a semiconductor device includes: placing a solder material onto a substrate, the solder material having a composition of silver between about 2.2% and about 2.8%; heating the solder material past a eutectic temperature; and cooling the solder material from a solidus start temperature to a solidus end temperature, wherein a difference between the solidus start temperature and the solidus end temperature is at least 13° C., wherein after the cooling the solder material the solder material is free from silver-based intermetallic compound needles. In an embodiment the solder material has a composition of bismuth between about 4% and about 4.4%. In an embodiment the solder material has a composition of copper between about 0.5% and about 1.1%. In an embodiment after the cooling the solder material the solder material has a tensile strength of about 96.7 MPa. In an embodiment after the cooling the solder material the solder material has an elongation of about 39%. In an embodiment the substrate is part of a flip chip chip scale package. In an embodiment the substrate is part of a chip on wafer on substrate.

In accordance with yet another embodiment, a semiconductor device includes: a first semiconductor die and a second semiconductor die encased within an encapsulant; an interposer substrate bonded to the first semiconductor die and the second semiconductor die; a substrate bonded to the interposer substrate; and an external connection on the substrate, the external connection includes: tin; silver at a concentration of between about 2.2% and about 2.8%; bismuth at a concentration of between about 4% and about 4.4%; and copper at a concentration of between about 0.5% and about 1.1%. In an embodiment the external connection has a tensile strength of about 96.7 MPa. In an embodiment the external connection has an elongation of about 39%. In an embodiment the external connection further comprises nickel. In an embodiment the external connection further comprises germanium. In an embodiment the external connection is free from silver-based needles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    applying an external connector to a substrate, the external connector comprising:
        a first tensile raising material at a first percentage of between about 2.2% and less than 2.8%;
        a second tensile raising material at a second percentage of between about 4% and about 4.4%; and
        a eutectic modifier at a third percentage of between about 0.5% and about 1.1%; and
    reflowing the external connector, wherein after the reflowing the external connector, the external connector is free from silver-based intermetallic compound needles.

2. The method of claim 1, wherein the first tensile raising material comprises silver, the second tensile raising material comprises bismuth, and the eutectic modifier comprises copper.

3. The method of claim 1, wherein the substrate is part of a fan-out package.

4. The method of claim 1, wherein the substrate is part of a wafer level chip scale package.

5. The method of claim 1, wherein the substrate is part of an integrated fan out on substrate structure.

6. The method of claim 1, wherein the substrate is part of a chip on wafer on substrate.

7. The method of claim 1, wherein the external connector further comprises:
    nickel; and
    germanium.

8. A method of manufacturing a semiconductor device, the method comprising:
    placing a solder material onto a substrate, the solder material having a composition of silver between about 2.2% and about 2.8%;
    heating the solder material past a eutectic temperature; and
    cooling the solder material from a solidus start temperature to a solidus end temperature, wherein a difference between the solidus start temperature and the solidus end temperature is at least 13° C., wherein after the cooling the solder material the solder material is free from silver-based intermetallic compound needles.

9. The method of claim 8, wherein the solder material has a composition of bismuth between about 4% and about 4.4%.

10. The method of claim 9, wherein the solder material has a composition of copper between about 0.5% and about 1.1%.

11. The method of claim 8, wherein after the cooling the solder material the solder material has a tensile strength of about 96.7 MPa.

12. The method of claim 11, wherein after the cooling the solder material the solder material has an elongation of about 39%.

13. The method of claim 8, wherein the substrate is part of a flip chip chip scale package.

14. The method of claim 8, wherein the substrate is part of a chip on wafer on substrate.

15. A semiconductor device comprising:
    a first semiconductor die and a second semiconductor die encased within an encapsulant;
    an interposer substrate bonded to the first semiconductor die and the second semiconductor die;
    a substrate bonded to the interposer substrate; and
    an external connection on the substrate, the external connection comprising:
        tin;
        silver at a concentration of between about 2.2% and less than 2.8%;
        bismuth at a concentration of between about 4% and about 4.4%; and copper at a concentration of between about 0.5% and about 1.1%.

16. The semiconductor device of claim 15, wherein the external connection has a tensile strength of about 96.7 MPa.

17. The semiconductor device of claim 15, wherein the external connection has an elongation of about 39%.

18. The semiconductor device of claim 15, wherein the external connection further comprises nickel.

19. The semiconductor device of claim 15, wherein the external connection further comprises germanium.

20. The semiconductor device of claim 15, wherein the external connection is free from silver-based needles.

* * * * *